(12) United States Patent
Kilian

(10) Patent No.: US 8,098,062 B2
(45) Date of Patent: Jan. 17, 2012

(54) COMPARATOR CIRCUIT HAVING LATCHING BEHAVIOR AND DIGITAL OUTPUT SENSORS THEREFROM

(75) Inventor: Wayne Kilian, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 626 days.

(21) Appl. No.: 12/196,979

(22) Filed: Aug. 22, 2008

(65) Prior Publication Data

US 2010/0045268 A1 Feb. 25, 2010

(51) Int. Cl.
*G01R 33/06* (2006.01)
(52) U.S. Cl. .................................................. 324/207.2
(58) Field of Classification Search .................. None
See application file for complete search history.

(56) References Cited

U.S. PATENT DOCUMENTS

| | | | | |
|---|---|---|---|---|
| 4,634,897 A | * | 1/1987 | Yoshioka | 327/65 |
| 4,833,406 A | * | 5/1989 | Foster | 324/225 |
| 4,908,527 A | * | 3/1990 | Van Antwerp | 327/511 |
| 5,619,137 A | * | 4/1997 | Vig et al. | 324/251 |
| 6,218,823 B1 | | 4/2001 | Keeth | |
| 7,023,191 B2 | | 4/2006 | Bernacchia et al. | |
| 2009/0302822 A1 | * | 12/2009 | Chao et al. | 323/313 |

* cited by examiner

*Primary Examiner* — Paresh Patel
(74) *Attorney, Agent, or Firm* — Shumaker & Sieffert, P.A.

(57) ABSTRACT

A digital output sensor (110) includes a sensing structure (105) including at least one sensing element. The sensing structure (105) outputs a differential sensing signal (106, 107). An integrated circuit (100) includes a substrate (101) including signal conditioning circuitry for conditioning the sensing signal (106, 107). The signal conditioning circuitry includes a differential amplifier (115) coupled to receive the sensing signal and provide first and second differential outputs (116, 117), and a comparator (120) having input transistors (Q27, Q28) coupled to receive outputs from the differential amplifier. The comparator (120) also includes first and second current-mirror loads (Q19/Q21 and Q22/Q20) coupled to the input transistors (Q27, Q28) in a cross coupled configuration to provide hysteresis, wherein the first and second current-mirror loads provide differential drive currents (121,122). An output driver (125) is coupled to receive the differential drive currents (121, 122). An output stage (130) includes at least one output transistor which is coupled to the output driver for providing a digital output for the sensor. A voltage regulator (140) is coupled to receive a supply voltage (VS) and output at least one regulated supply voltage (VREG), wherein the regulated supply voltage is coupled to the sensing structure (105), the differential amplifier (115) and the comparator (120).

5 Claims, 7 Drawing Sheets

US 8,098,062 B2

COMPARATOR CIRCUIT HAVING LATCHING BEHAVIOR AND DIGITAL OUTPUT SENSORS THEREFROM

FIELD OF THE INVENTION

Embodiments of the invention relate to digital output sensors, and more particularly integrated circuit-based digital output sensors.

BACKGROUND

Sensors are used to sense a variety of different quantities. For example, the quantity or parameter to be sensed can be a magnetic field, a current, a temperature, a pressure or a position. Commonly used sensing structures include piezoelectric elements positioned on or formed in a flexible diaphragm for sensing pressure, electrically conducting or semiconducting elements based on the Hall effect, magnetoresistance or variable reluctance structures for sensing magnetic fields.

Hall sensors are one form of magnetic field sensor that can be manufactured at low cost particularly when embodied as an integrated (monolithic) sensor. When a current-carrying conductor or semiconducting Hall element is placed into a magnetic field, a voltage will be generated orthogonal to the direction of both the current and the magnetic field. This principle is known as the Hall effect.

The Hall element is generally constructed from a thin sheet of conductive or semiconducting material with output connections perpendicular to the direction of current flow. When subjected to a magnetic field, the Hall element responds with an output voltage proportional to the magnetic flux density. The output voltage is generally very small (on the order of several µV) and thus requires electronics to provide gain to achieve useful signal levels. When the Hall element is combined with the associated signal processing sensor electronics, it forms a Hall effect sensor. Integrated Hall effect sensors comprise an integrated circuit chip (e.g. silicon) that contains the Hall element and the signal conditioning electronics.

Analog sensors provide an analog output voltage which is proportional to the magnitude of the magnetic field input (sensed). Conventional digital output Hall sensors use a Schmitt trigger or other hysteresis-generating circuitry to convert the basic analog output sensor to a digital output sensor. The output of a digital sensor is one of two binary levels, 1 or 0 (ON or OFF). The Schmitt trigger or other equivalent hysteresis-generating circuit is operable to convert the analog output of the amplifier, that is coupled to the Hall elements, into a binary output level, 1 or 0 (ON or OFF) and to provide a reasonable noise margin between the sensed binary states.

Supply voltage rejection and temperature compensation are important performance characteristics for sensors such as integrated Hall sensors. For example, digital output Hall sensors require these characteristics to control the amount of change in the magnetic transition points, that define the binary output states, over operating ranges of both supply voltage and temperature.

A common technique for obtaining supply voltage rejection is to include a voltage regulator to provide a stable bias for the Hall element and the signal processing circuitry. It is also desirable for the regulated voltage provided by the voltage regulator to be nearly constant over temperature, to provide a reference for temperature compensation. The trade-offs in using precision on-chip voltage regulation is larger die size/cost and additional supply current. Driven primarily by commercial Hall market pricing, specifications and die size constraints imposed by contemporary surface mount packages, a need exists for having a small die size that operates at lower power and also provides competitive magnetic specifications.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe new comparator circuitry operable to receive a differential input signal and provide a differential output signal and digital output sensors therefrom. The comparator circuits described herein utilize internal positive feedback to provide the hysteretic relationship between the sensed binary signal levels, thus avoiding the need in conventional designs for a pair of Schmitt triggers or the need for a feedback loop to the amplifier stage that precedes the comparator. Comparators according to embodiments of the invention also provide new temperature compensation and supply voltage rejection circuitry. These aspects lower power requirements and reduce die size, thereby reducing the cost of the sensor. Comparators according to embodiments of the invention can be embodied as balanced circuitry that comprises two identical half circuits (and thus has full symmetry).

Digital output sensors according to embodiments of the invention include a sensing structure comprising at least one sensing element. The sensing structure outputs a differential sensing signal. An integrated circuit includes a substrate including signal conditioning circuitry for conditioning the sensing signal. The sensing structure can also be on the same substrate for a fully monolithic sensor embodiment.

The signal conditioning circuitry includes a differential amplifier coupled to receive the sensing signal and provide first and second differential outputs, and a comparator having input transistors coupled to receive outputs from the differential amplifier. The comparator includes first and second input transistors, coupled to first and second current-mirror loads that are cross coupled to achieve high gain, wherein the current-mirror loads provide differential feedback currents to the emitters of the input transistors in a cross coupled configuration. The first and second input transistor emitters are coupled to first and second resistors, wherein feedback current from the current-mirror loads produces an offset voltage that must be overcome by the input signal to the comparator in order for the comparator to switch states. When the comparator switches, the states of the current-mirror loads are reversed (e.g. one saturated and one off) so that the feedback current, hence the offset voltage, is switched from one side of the input stage to the other, thereby providing hysteresis that results in noise margin between the sensed binary states. The first and second current-mirror loads also provide differential drive currents. An output driver is coupled to receive the differential drive currents. An output stage comprises at least one output transistor which is coupled to the output driver for providing a digital output for the sensor. A voltage regulator is coupled to receive a supply voltage (VS) and output at least one regulated supply voltage (VREG), wherein the regulated supply voltage is coupled to the sensing structure, the differential amplifier and the comparator.

DETAILED DESCRIPTION

Figure 1:
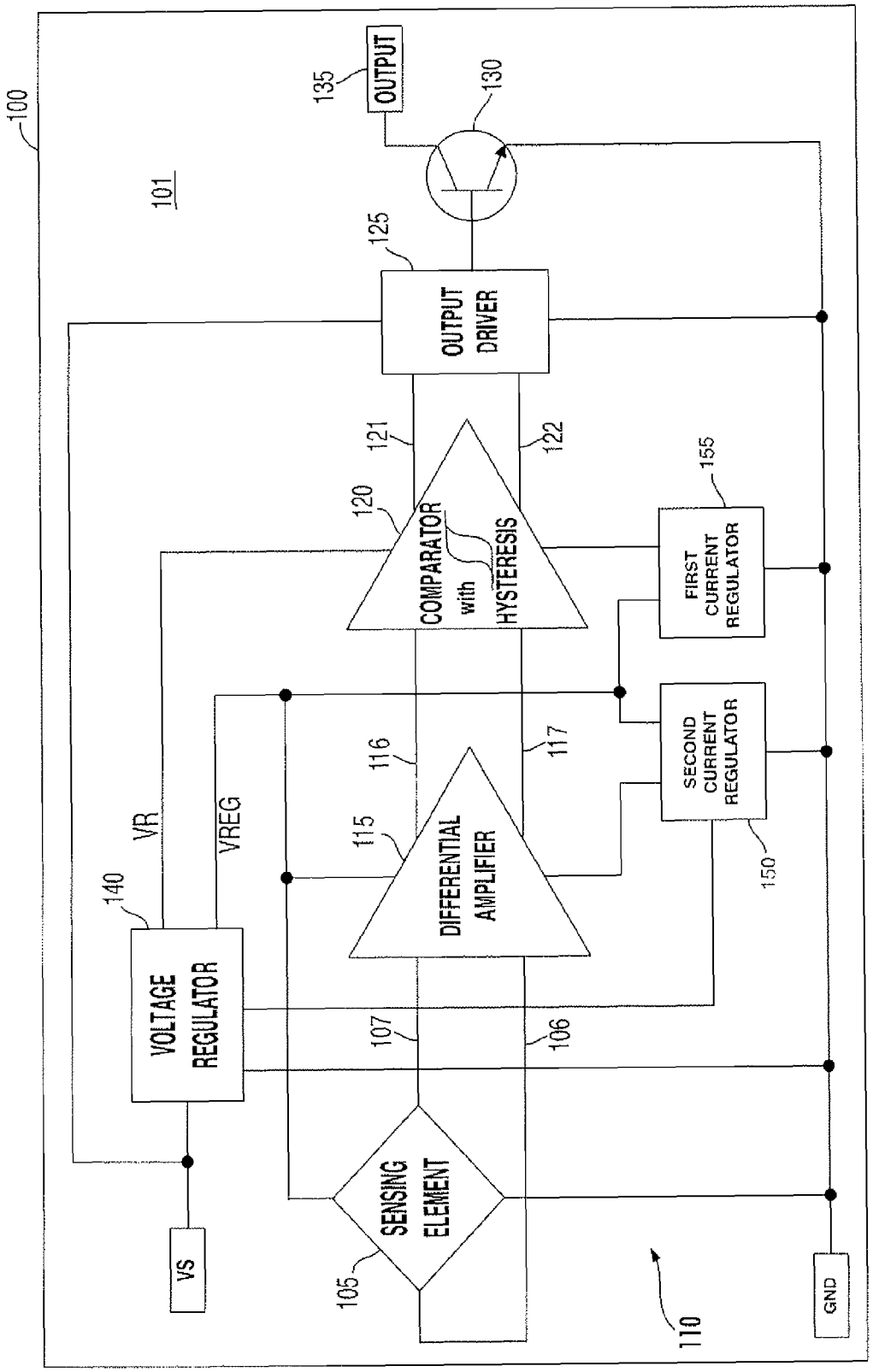
FIG. 1 is a block diagram of an integrated circuit including a digital output sensor according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe new comparator circuitry having current-mirror loads which receive differential inputs and provide differential drive currents, and digital output sensors therefrom. Embodied as a Hall effect sensor, embodiments of the present invention replace conventional Schmitt trigger and interstage feedback based digital output sensors with sensors based on comparator circuitry having internal feedback for the hysteresis function. Comparator circuitry according to embodiments of the invention provide a compact, fully differential design having latching behavior, temperature compensation and an output driver interface for the digital output sensor, available from circuitry generally with reduced complexity and thus reduced die size. Sensors according to embodiments of the invention provide high levels of supply voltage rejection as well as high levels of temperature stability through new bias configurations that are described below. Other portions of the signal processing electronics help provide a compact sensor design, such as the voltage regulator design as described below.

Referring to FIG. 1, a block diagram of an integrated circuit 100 including a digital output sensor 110 according to an embodiment of the invention is shown. One specific embodiment for implementing the digital output sensor 110 is shown in the schematic described below relative to FIG. 2. All references below to transistor level circuitry generally refer to FIG. 2.

The IC 100 comprises a substrate 101 upon which the digital output sensor 110 which comprises signal conditioning circuitry for conditioning sensing signals is formed, generally using conventional integrated circuit processing (lithography, etching, ion implantation, diffusion, deposition (e.g. (LPCVD)). The substrate 101 can comprise a silicon substrate (silicon chip). The sensor 110 includes a sensing structure comprising at least one sensing element 105. Although the sensing element 105 is shown formed on the substrate 101, in other embodiments of the invention the sensing structure can be formed off-chip.

The sensing structure can comprise single element or bridge-type or other balanced output sensor types. One embodiment comprises a flexible diaphragm having a plurality of piezoresistive elements within or coupled to the diaphragm. Other example embodiments of the invention include one or a plurality of Hall elements, or one or a plurality of magnetoresistive elements.

The sensing structure is operable to output a differential sensing signal 106, 107. The signal conditioning circuitry includes a differential amplifier 115 coupled to receive the differential sensing signals 106, 107 and provide first and second differential outputs 116 and 117. A second current regulator 150 (acting as a current sink) is shown coupled to the differential amplifier 115.

A comparator with hysteresis 120 having input transistors (See Q27 and Q28 in FIG. 2) is coupled to receive voltage outputs 116 and 117 provided by the differential amplifier 115. A first current regulator 155 is shown coupled to the comparator 120. As described below, the first current regulator 155 can be embodied as an epitaxial-resistor-referenced current regulator.

In one embodiment, the comparator 120 comprises internal feedback circuitry comprising a first current-mirror load (Q19, Q21) coupled to a collector of the first input transistor Q27 cross coupled to a second current mirror load (Q20, Q22) which is coupled to a collector of the second input transistor Q28. This cross coupling arrangement achieves high gain. In this particular embodiment, hysteresis is provided by coupling outputs of the first and second current-mirror loads respectively to the emitters of the second and first input transistors (a cross coupled configuration) and with first input transistor Q27 emitter coupled to first emitter resistor R7, second input transistor Q28 emitter coupled to second emitter resistor R8, first and second emitter resistors coupled together at a connection node to first current regulator 155. The first and second current-mirror loads provide differential drive currents shown as 121 and 122.

An output driver 125 is coupled to receive the differential drive currents 121 and 122. An output stage includes at least one output transistor 130, shown in FIG. 1 as an open collector NPN transistor 130, coupled to receive base drive from the output driver 125 to provide a digital output 135 for sensor 110.

A voltage regulator 140 receives a supply voltage VS and outputs at least one regulated supply voltage, shown as a first supply voltage VREG and a second supply voltage VR. VR can be at a higher level as compared to VREG. As shown in FIG. 1, VREG is shown coupled to the sensing structure 105 and the differential amplifier 115, while VR is shown coupled to the comparator 120. VS is shown coupled to the output driver 125. Voltage regulator 140 also comprises a voltage reference circuit that can include startup circuitry for providing startup current for the second current regulator 150.

Figure 2:
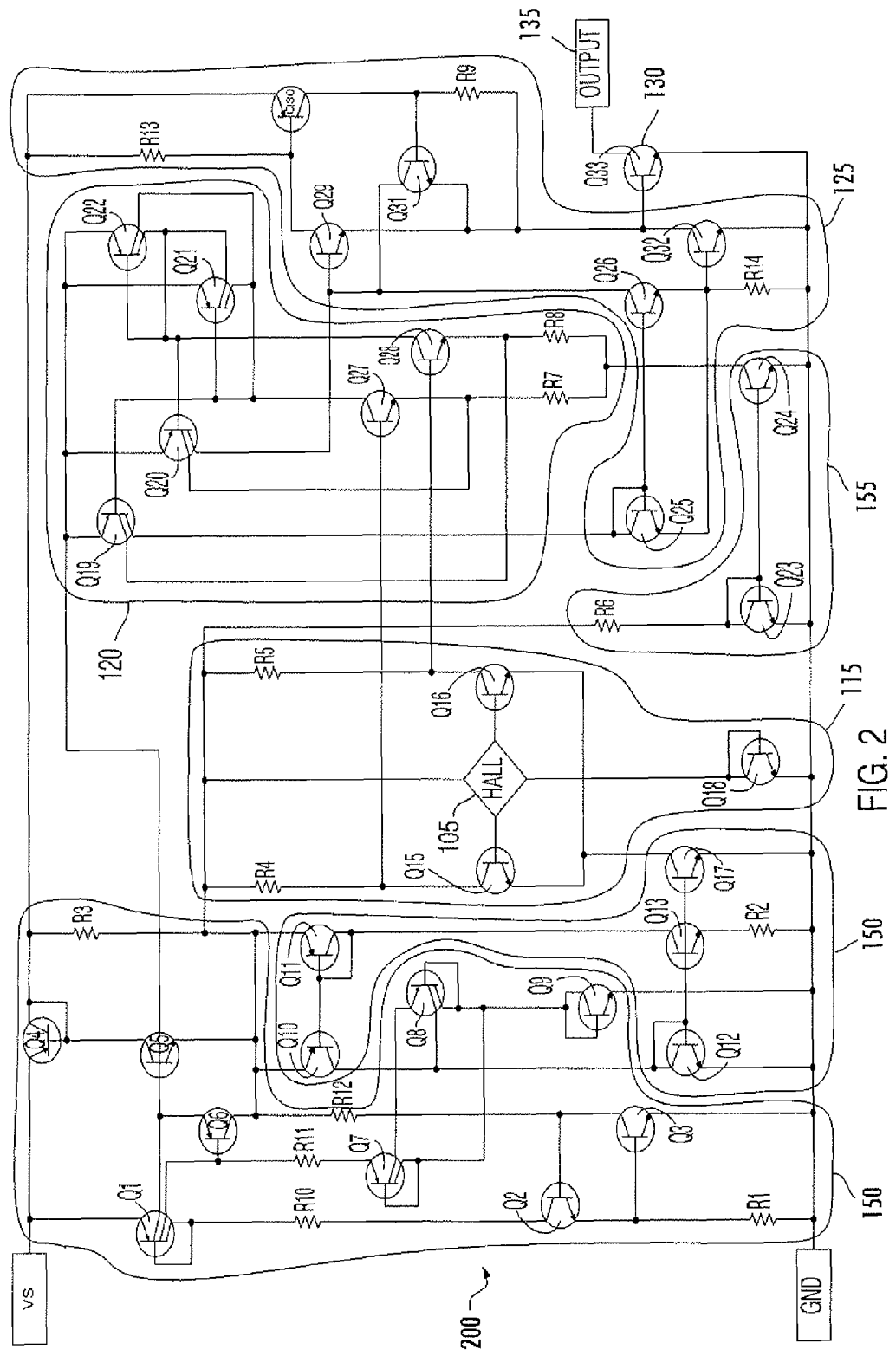
FIG. 2 is a circuit schematic for implementing one exemplary digital output sensor embodiment, according to another embodiment of the invention.

FIG. 2 is a circuit schematic for implementing one exemplary digital output sensor 200 embodiment, according to another embodiment of the invention. The blocks shown in FIG. 1 comprising voltage regulator 140, second current regulator 150, differential amplifier 115 coupled to the sensor element 105 (shown as a Hall element), comparator 120, first current regulator 155, output driver 125, and output transistor 130, are all identified in FIG. 2. The operation of the respective blocks shown in FIG. 2 is described in more detail below.

Figure 3:
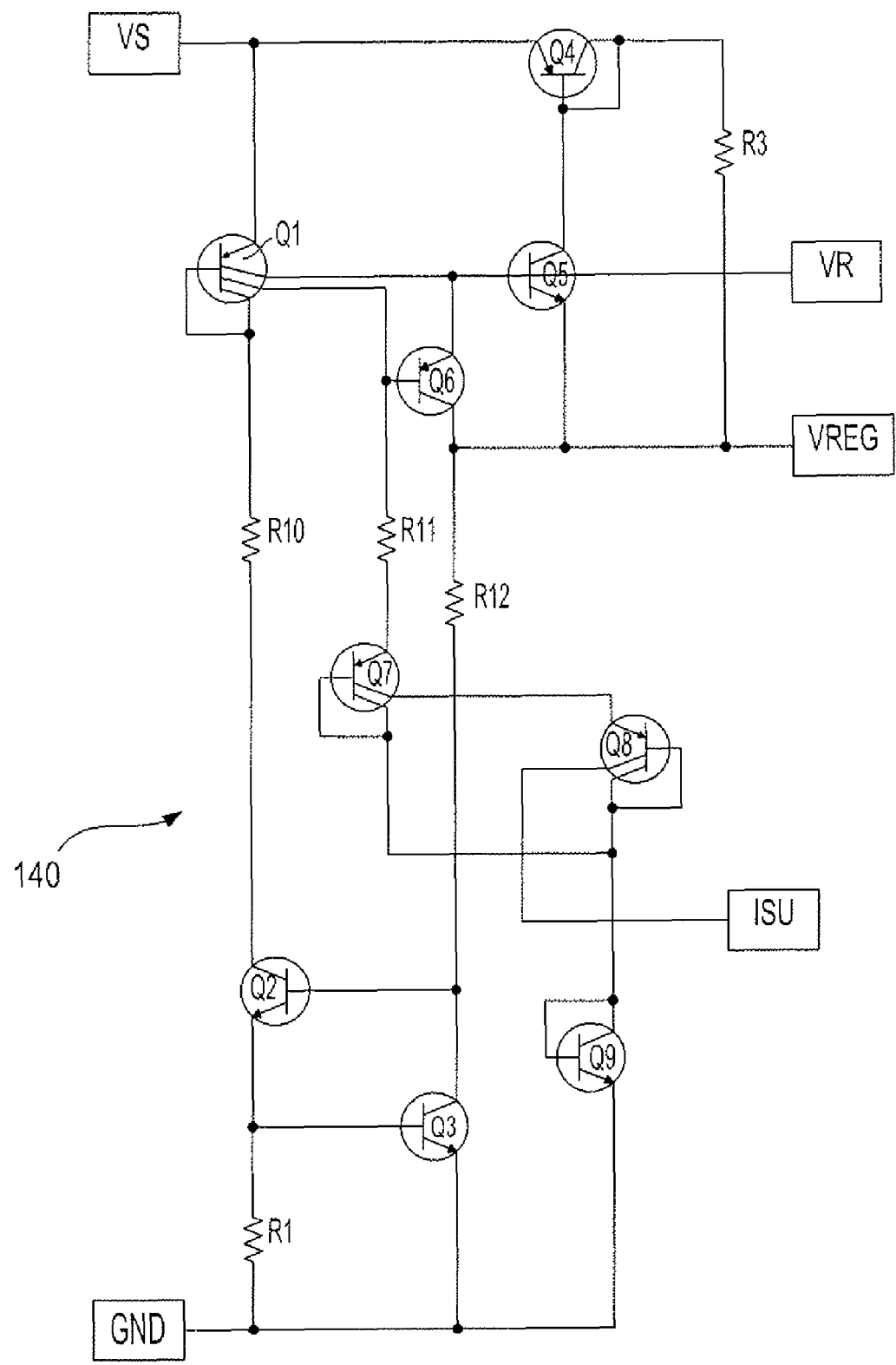
FIG. 3 is a circuit schematic for the voltage regulator shown in FIG. 2, according to an embodiment of the invention.

FIG. 3 is a circuit schematic for voltage regulator 140 shown in FIG. 2, according to an embodiment of the invention. Voltage regulator 140 is shown outputting voltages VR and VREG, where VR is about one forward-biased diode voltage ($V_{BE}$) above VREG (the $V_{BE}$ of Q5. This dual supply level feature is helpful for operation at low supply voltage and low temperature, by providing higher supply voltages to only the circuitry requiring the higher supply voltage (thus reducing the overall power dissipated). Upon power-up, current flows through resistors R3 and R12 to Q2 and Q3 which together with R1 comprise a $V_{BE}$ referenced current source. Regulated current flowing in Q2 also flows through Q1 which is shown as a lateral PNP which is connected as a current-mirror having dual outputs. A first mirrored current from Q1 flows through a voltage reference comprising Q7, Q8, Q9 and R11. Q7 and Q8 also comprise a current divider to source a small start-up current, shown as ISU, into the second current regulator 150 which is shown in FIG. 2 as a $V_T$ referenced current source. A second mirrored current from Q1 provides current to Q5 and Q6. Q6 provides shunt regulation for VR at the base terminal of Q5. Q5 provides series pass regulation for VREG. Q4 is shown as a diode-connected transistor that blocks potentially destructive currents in the event that VS is negative with respect to the supply voltage reference (GND). R10 limits potentially destructive currents through Q2 during an electrostatic discharge (ESD) event across VS and GND.

Figure 4:
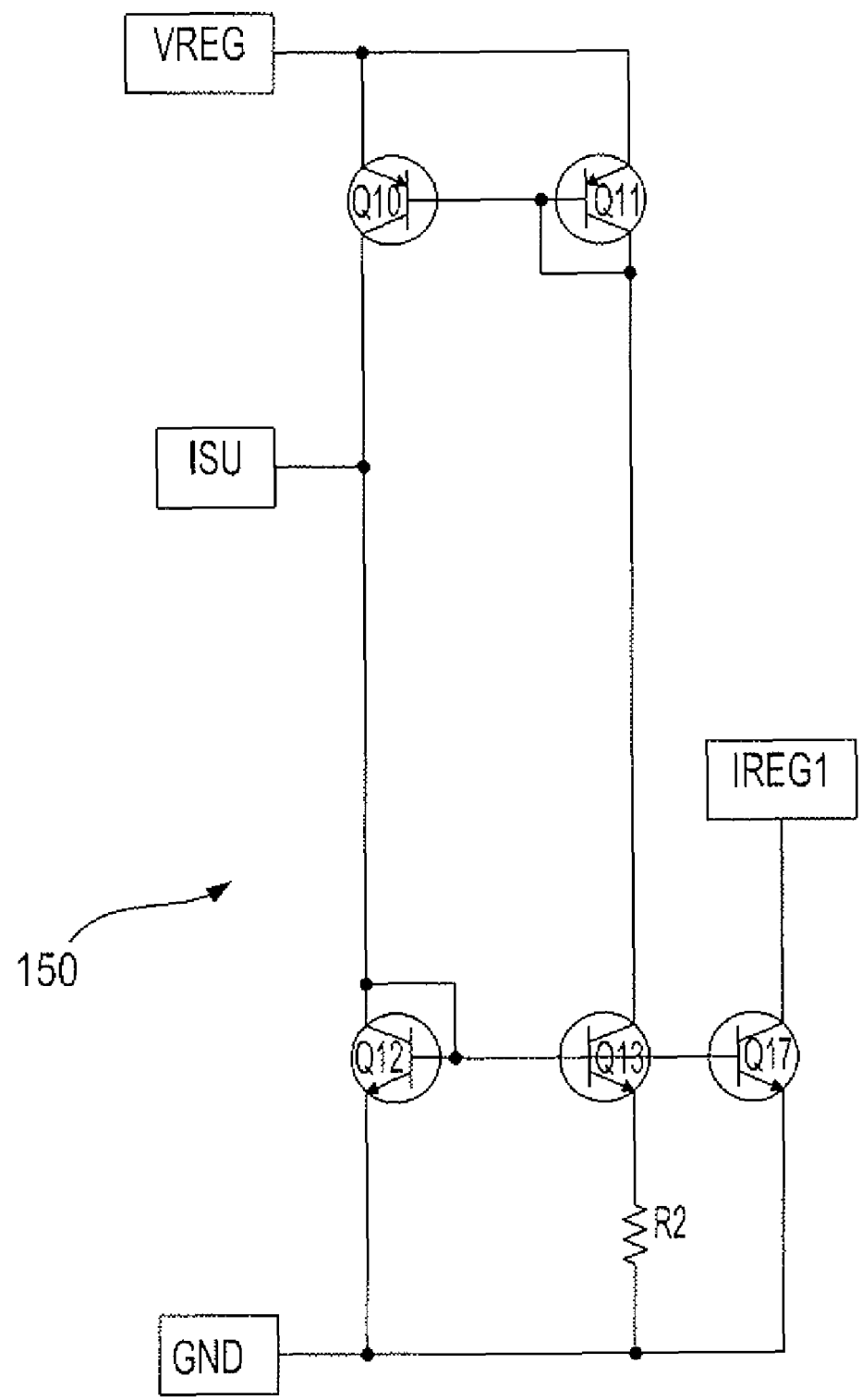
FIG. 4 is a circuit schematic for the current regulator embodied as a thermal-voltage ($V_T$) referenced current regulator shown in FIG. 2, according to an embodiment of the invention.

FIG. 4 is a circuit schematic for the second current regulator 150 embodied as a $V_T$ referenced current regulator 150 as shown in FIG. 2, according to an embodiment of the invention. Upon power-up, start up current (ISU) from voltage regulator circuit 140 is supplied to the collector/base of Q12 and the bases of Q13 and Q17, then collector current from Q13 provides bias to Q10 and Q11 which are connected as a current-mirror, thereby completing a positive feedback loop, commonly referred to as self bias. Q12 and Q17 are mirror connected, so that Q17 sinks a regulated bias current shown as IREG1 from the differential amplifier 115. This bias technique provides the $V_T$ referenced current, which in one embodiment is approximately $V_T$*ln 3/R2, where $V_T$=k*T/q; k is Boltzmann's constant, T is the temperature and q is the magnitude of an electronic charge.

Figure 5:
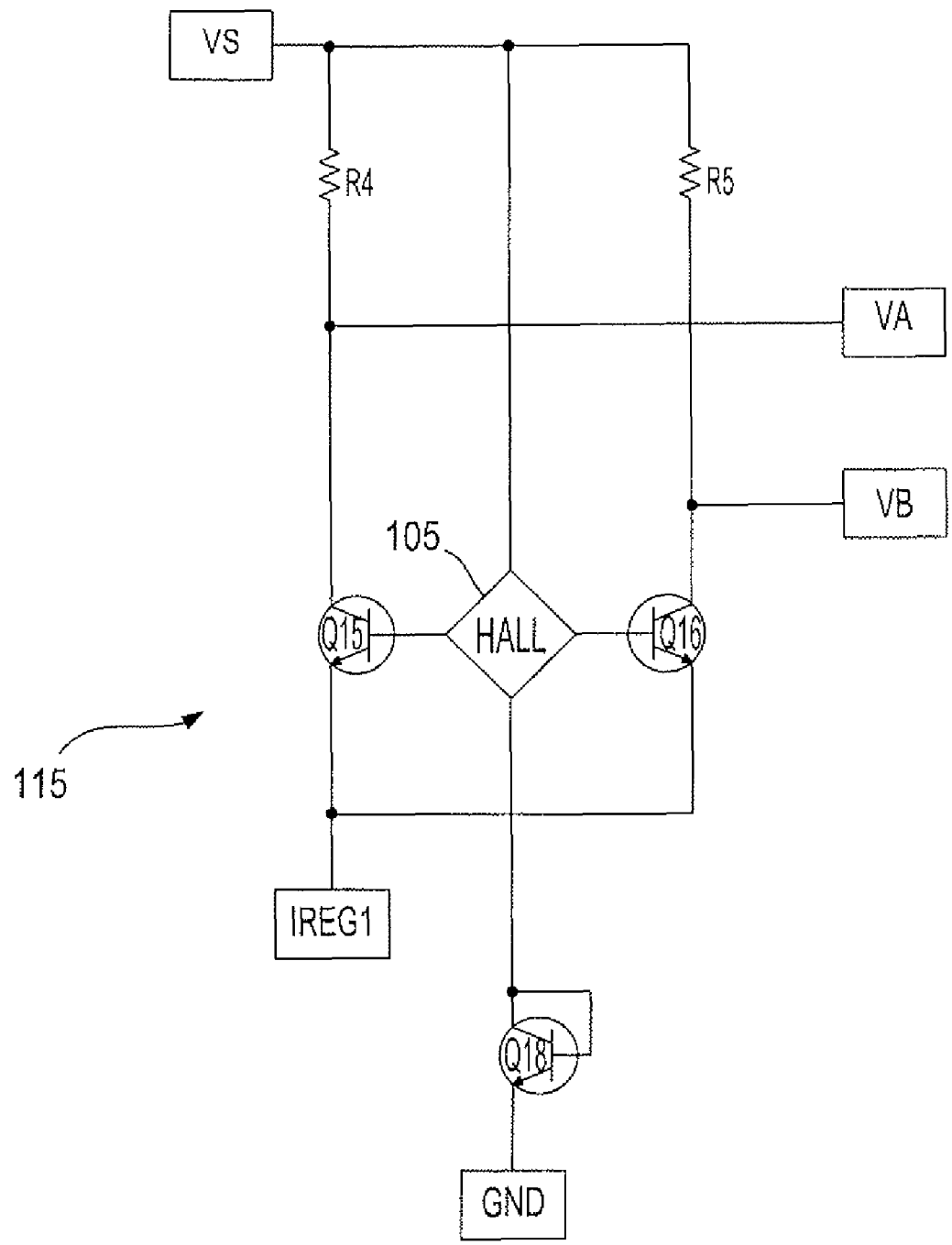
FIG. 5 is a circuit schematic for the differential amplifier coupled to a sensor element that is shown as a Hall element in FIG. 2, according to an embodiment of the invention.

FIG. 5 is a circuit schematic for differential amplifier 115 coupled to the sensor element 105 that is shown as a Hall sensor in FIG. 2, according to an embodiment of the invention. The $V_T$ referenced current, shown as IREG1 from the second current regulator 150 embodied as a $V_T$ referenced current regulator 150, is coupled to the emitters of Q15 and Q16. Collectors of Q15 and Q16 are coupled to load resistors R4 and R5, respectively. Q15 and Q16 are a matched pair, as are resistors R4 and R5. Differential outputs VA and VB are shown from the collectors of Q15 and Q16, respectively. Q18 provides a bias level shift. The small-signal voltage gain ($A_V$) of the differential amplifier 115 can be expressed as $A_V \approx gm*R4$, with R4=R5. $A_V$ is then directly proportional to R4 and inversely proportional to R2, $A_V$=ln3*R4/(2*R2), and this functional dependence can be used to provide temperature compensation as described below.

Figure 6:
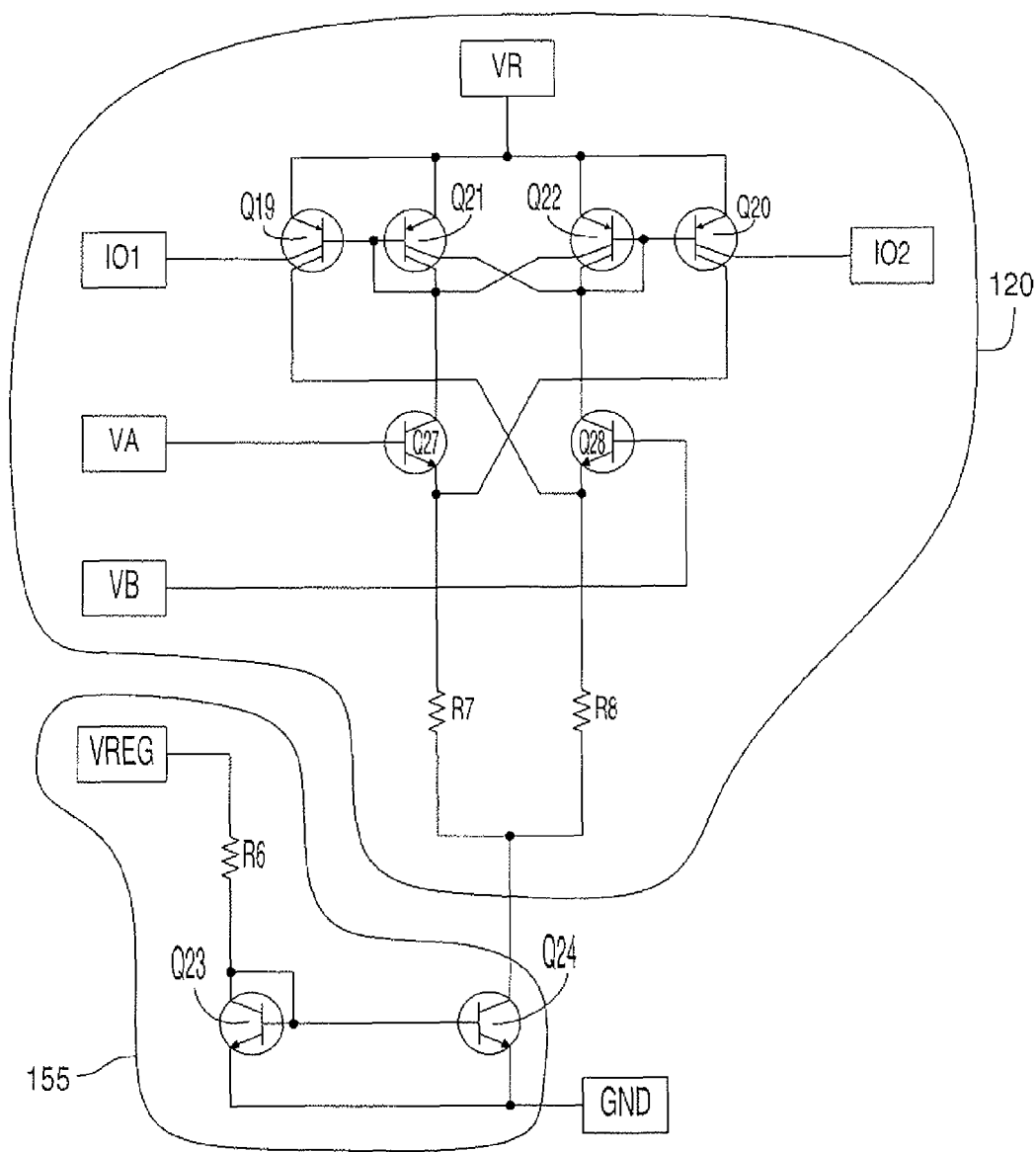
FIG. 6 is a circuit schematic for the comparator with hysteresis along with its associated current regulator, shown as an epitaxial-resistor-referenced current regulator in FIG. 2, according to an embodiment of the invention.

FIG. 6 is a circuit schematic for the comparator with hysteresis 120 along with the current regulator 155 shown in FIG. 2, according to an embodiment of the invention. As described above, comparator 120 includes first and second input transistors Q27 and Q28 which are coupled to receive differential outputs 116 (VA) and 117 (VB) from the differential amplifier 115. The comparator 120 comprises internal feedback circuitry comprising a first current-mirror load (Q19, Q21) coupled to a collector of first input transistor Q27, cross coupled to a second current-mirror load (Q22, Q20) which is coupled to a collector of the second input transistor Q28. Emitter degeneration resistors R7 and R8 are shown coupled to the emitters of Q27 and Q28, respectively. The current-mirror loads (Q19, Q21) and (Q20, Q22) are cross-coupled to emitter degeneration resistors R7 and R8 to provide a hysteresis voltage ($\Delta V$) for comparator 120, which is described in more detail below. Q19 of the first current-mirror load provides the first differential output current 101, while Q20 of the second current-mirror load (Q20, Q22) provides the other differential output current 102.

Comparator 120 can be seen to be a balanced circuit that provides differential input and output (is fully differential), and is shown embodied as two identical half circuits (thus has full symmetry). Comparator 120 is shown having identical first and second half circuits, the first half circuit comprising said first input transistor Q27, the first current-mirror load (Q19, Q21) and the first emitter degeneration resistor R7, while the second half circuit comprises the second input transistor Q28, the second current-mirror load (Q20, Q22) and the second emitter degeneration resistor R8.

The current-mirror loads are cross-coupled to emitter degeneration resistors R7 and R8 to provide a hysteresis voltage ($\Delta V$) at the switch points for comparator 120, defined as the differential voltage measured at the emitters of Q27 and Q28 ($\Delta V = VQ27_E - VQ28_E$). In the case of the sensing elements 105 being Hall sensors, where $V_H$ is the bias voltage across the Hall element, $\Delta V \approx (V_H/N)*(R7/R6)$, where the value of N depends on the ratio of collector currents of Q27 and Q28 to the mirrored feedback currents into emitter resistors R7 and R8, and also on the ratio between input and output currents of the first current regulator 155. R6 is referred to herein as a matching resistor for reasons made clear below. First current regulator 155 comprises matching resistor R6, and transistors Q23 and Q24. Matching resistor R6 delivers input current to transistors Q23 and Q24 which are connected as a current-mirror, and can be scaled to set the ratio of output current flowing in the collector of Q24 to the input current flowing through R6. The output current of first current regulator 155 is also the bias current for comparator 120. Matching resistor R6 is coupled to VREG so that the voltage across R6 is approximately equal to the voltage across the sensing element 105 shown as a Hall element 105. This arrangement reduces the magnetic operate and release sensitivity to VREG, because the sensing signal (106, 107) from Hall element 105 and the hysteresis voltage ($\Delta V$) are both proportional to VREG.

The regulated voltage VR from voltage regulator 140 is shown coupled to the emitters of the current-mirror load transistors (Q19, Q21 and Q22, Q20). These current-mirror load transistors are shown embodied as multi-collector lateral PNPs, wherein the first and second current-mirror loads provide differential drive currents 121 (IO1) and 122 (IO2).

Figure 7:
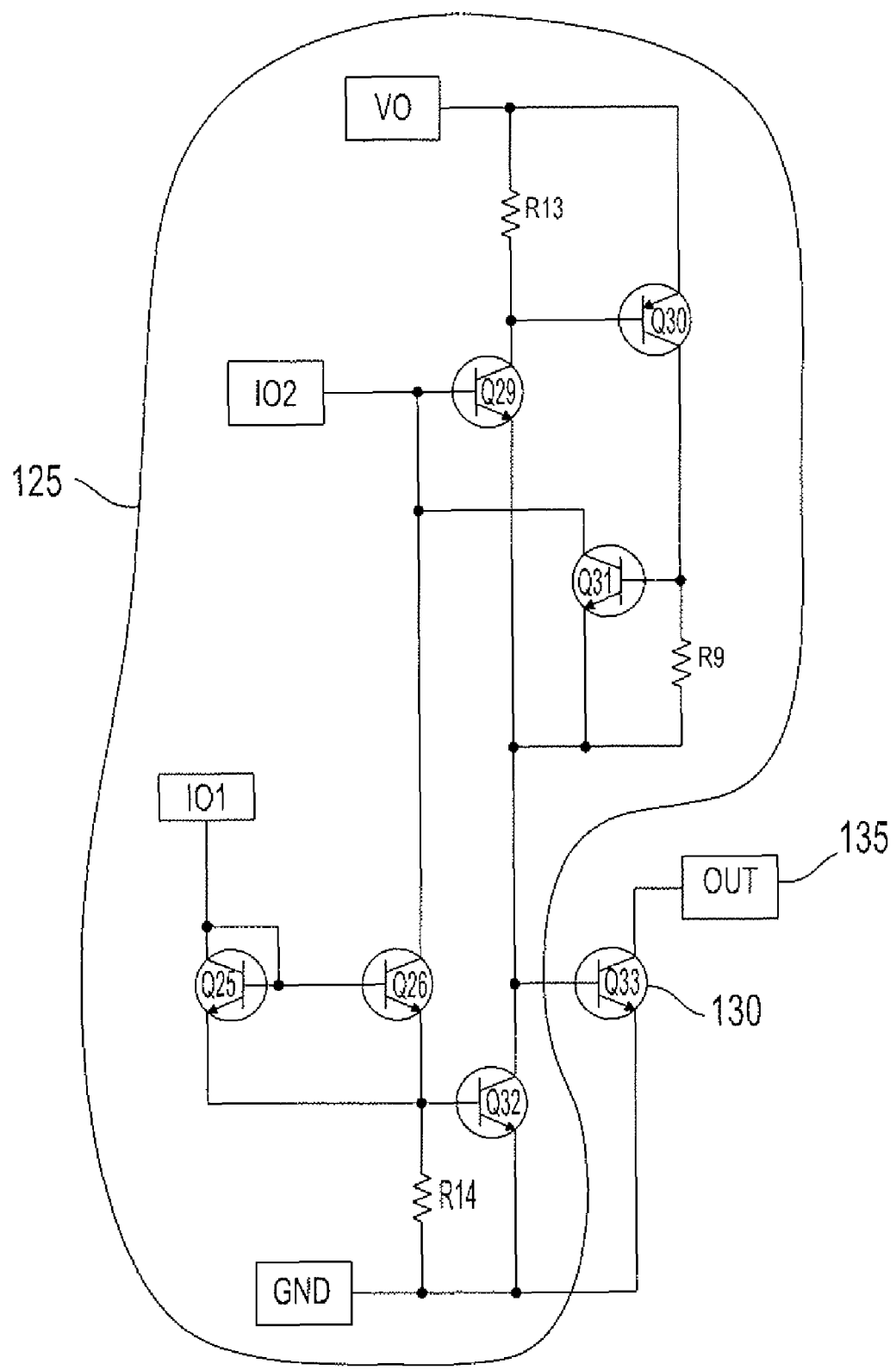
FIG. 7 is a circuit schematic for the output driver shown connected to an open collector NPN output transistor in FIG. 2, according to an embodiment of the invention.

FIG. 7 is a circuit schematic for the output driver 125, according to an embodiment of the invention, shown connected to open collector NPN output transistor 130. Driver 125 receives currents IO1 and IO2 from comparator 120. Operation of output transistor 130 (shown as Q33) is controlled by 102 sourced into the base of Q29, which then operates Q30 to provide the required drive current to the base of Q33. The drive current flowing through R9 produces a voltage drop that is sensed by Q31 which regulates the drive current by limiting the amount of IO2 available to the base of Q29. The positive temperature coefficient of R9 acting together with the negative temperature coefficient of the base-emitter voltage of Q31 produce higher drive current at low temperature to compensate for the reduction in current gain of Q33 at low temperature. Shut-off of Q33 is controlled by IO1 sourcing current to Q25 and Q26 which are connected as a current-mirror. Q26 shuts off Q29 and subsequently, the drive current for Q33. Current exiting the emitters of Q25 and Q26 source current into the base of Q32, which provides rapid shut off of Q33. Resistors R13 and R14 ensure adequate shut off of Q30 and Q32 respectively.

It is generally desirable for a digital magnetic sensor to have magnetic switch points and hysteresis that have minimal change over the operating temperature range for the sensor. According to an embodiment of the invention, temperature dependencies of the sensed signal voltage from sensing element 105 such as a Hall element 105, the voltage gain of the differential amplifier 115 and the hysteresis voltage of the comparator 120 can be combined in a manner that provides cancellation of the dependencies. The temperature compensation of the sensor magnetic parameters resulting from such combination is herein described as relating to an embodiment comprising a silicon-based integrated circuit, based on bipolar technology with an n-type epitaxial layer.

The magnetic hysteresis ($\Delta B$) of sensor circuit 200 as shown in FIG. 2 is proportional to the hysteresis voltage of comparator 120, expressed above as $\Delta V \approx (V_H/N)*(R7/R6)$. $\Delta B$ is inversely proportional to both the magnetic responsivity ($R_H$) of Hall element 105 and the voltage gain ($A_V$) of differential amplifier 115, giving $\Delta B \approx \Delta V/(R_H*A_V)$ where $R_H$ is in S.I. units of volts/tesla. $R_H$ can be described as $R_H \approx V_H*\mu H*G/\lambda$ where: $V_H$ is the Hall cell bias voltage, $\mu H$ is the Hall mobility including the Hall scattering factor and the $G/\lambda$ ratio represents a dimensionless constant, dependent on a particular Hall element geometry. Partial temperature compensation of the differential amplifier gain is apparent from the transconductance (gm), expressed as $gm \approx IREG1/(2*V_T)$, with $IREG1 \approx V_T*\ln 3/R2$ or $gm \approx \ln 3/(2*R2)$, where $V_T$ cancels out leaving only the temperature coefficient of R2 in the denominator.

As described above, the small-signal voltage gain ($A_V$) of the differential amplifier can be expressed as $A_V \approx gm*R4$, with R4=R5. $A_V$ is then directly proportional to R4 and inversely proportional to R2; $A_V \approx \ln 3*R4/(2*R2)$. Expanding the above equation for the magnetic hysteresis gives $\Delta B \approx (V_H/N)*(R7/R6)/((V_H*\mu H*G/\lambda)*(\ln 3*R4/(2*R2)))$ from which: $V_H$ cancels out, temperature coefficients of R4 and R7 cancel based on close matching provided by being fabricated from the same diffused layer and the temperature coefficient of matching resistor R6 will cancel the temperature coefficient inherent in the Hall mobility ($\mu H$), that is due to the bulk conductivity of the n-type epitaxial (epi) layer comprising the Hall element, if R6 also is fabricated from the same epi layer. With the exception of the temperature coefficients of R2 and the Hall mobility scattering parameter, all temperature coefficients have been shown to directly cancel out in the expression for $\Delta B$. However, temperature coefficient canceling can be further improved. For example, R2 can be fabricated from a particular diffused, p-type layer so that the negative temperature coefficient of the p-type layer conductivity will nearly cancel the positive temperature coefficient of the Hall mobility scattering factor over a wide temperature range. In such an arrangement, the temperature compensation of $\Delta B$ for sensor circuit 200 becomes nearly ideal.

Comparators according to embodiments of the invention are useful for a variety of digital output applications that require processing differential inputs to provide digital outputs having hysteresis. Embodied as a Hall sensor, sensors according to embodiments of the invention generally achieve latching performance with 50 Gauss typical operate and release, do not require resistor trimming to achieve magnetic latching performance, and generally operate respectively over voltage and temperature ranges of from 3 to 24 volts and −40 to 150° C. Sensor according to embodiments of the invention are generally reverse battery protected as described above and will generally fit into low cost packages, such as a SOT-23W package.

Embodiments of the invention can be integrated into a variety of process flows to form a variety of devices and related products. Exemplary devices and products besides magnetic field sensors such as position and current sensors include temperature, and pressure sensors.

The semiconductor substrates may include various elements therein and/or layers thereon. These can include barrier layers, other dielectric layers, device structures, active elements and passive elements including source regions, drain regions, bases, emitters, collectors, conductive lines, conductive vias, etc. Moreover, although the invention has generally been described using bipolar transistors, embodiments of the invention can utilize a variety of other processes including CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A system, comprising:
   a comparator, comprising:
   input transistors comprising first and second input transistors coupled to receive differential outputs, and
   first and second current-mirror loads coupled to said input transistors in a cross coupled configuration to provide hysteresis, said first and second current-mirror loads providing differential drive currents, wherein said first current-mirror load is coupled to a collector of said first input transistor and said second current-mirror load is coupled to a collector of said second input transistor; and
   first and second emitter degeneration resistors coupled to emitters of the first and second input transistors, respectively, wherein the cross coupling comprising the first current-mirror load coupled to the second emitter degeneration resistor and the second current-mirror load coupled to the first emitter degeneration resistor to provide hysteresis; and
   a current regulator coupled to the comparator, comprising a matching resistor that is coupled to a regulated supply voltage and a third current mirror coupled to the matching resistor, wherein the third current mirror is coupled to provide bias current for the comparator.

2. The system of claim 1, wherein said comparator comprises identical first and second half circuits, said first half circuit comprising said first input transistor, said first current-mirror load and said first emitter degeneration resistor, and said second half circuit comprising said second input transistor, said second current-mirror load and said second emitter degeneration resistor.

3. The system of claim 1, further comprising cross coupling between said first current-mirror load and said second-current-mirror load.

4. The system of claim 3, wherein said cross coupling between said first current-mirror load and said second current-mirror load comprises a coupling of a common base of said first current-mirror load to a collector of a transistor of said second current-mirror load and a coupling of a common base of said second current-mirror load to a collector of a transistor of said first current-mirror load.

5. The system of claim 4, wherein said first and second current-mirror loads comprise multi-collector lateral pnp transistors.

* * * * *